United States Patent [19]

Uchida et al.

[11] Patent Number: 4,939,472

[45] Date of Patent: Jul. 3, 1990

[54] INTEGRATING CIRCUIT

[75] Inventors: Yoshitaka Uchida; Masaharu Mori, both of Tokyo, Japan

[73] Assignee: Clarion Co., Ltd., Tokyo, Japan

[21] Appl. No.: 293,111

[22] Filed: Jan. 3, 1989

[30] Foreign Application Priority Data

Jan. 14, 1988 [JP] Japan .................................... 63-7140

[51] Int. Cl.[5] ......................... H03K 5/00; G06G 7/18

[52] U.S. Cl. .................................... 328/127; 307/353; 307/542; 328/151

[58] Field of Search ................ 307/353, 542; 328/127, 328/128, 151

[56] References Cited

U.S. PATENT DOCUMENTS

| | | | |
|---|---|---|---|
| 3,594,649 | 7/1971 | Rauch | 328/127 |
| 4,066,919 | 1/1978 | Huntington | 307/353 |
| 4,373,141 | 2/1983 | Sanders | 307/353 |

*Primary Examiner*—John Zazworsky

*Attorney, Agent, or Firm*—Wallenstein, Wagner & Hattis, Ltd.

[57] ABSTRACT

An integrating circuit is configured to feed a correlator output to a first integrating and dumping circuit and to a second integrating and dumping circuit and to subsequently add their respective outputs in a composing circuit. The first integrating and dumping circuit and the second integrating and dumping circuit are activated selectively by a switching control switch to perform their integrating and dumping operations.

9 Claims, 6 Drawing Sheets

INTEGRATING CIRCUIT

FIELD OF THE INVENTION

This invention relates to an integrating circuit used in a spread spectrum receiver

BACKGROUND OF THE INVENTION

It is known that in a spread spectrum receiver, a matched filter or convolver is used as a correlator to demodulate a spread signal and subsequently integrate the demodulated output for a predetermined time to reduce influences of multipath transmission.

FIG. 6(A) shows that correlation spikes a-1 and a-2 appear in a demodulated output as a result of multipath transmission.

When using the signal as an input and effecting integration in a period longer than the distance between the two correlation spikes, energies of two correlation spikes are added as shown in FIG. 6(B), and the demodulated output is increased.

For example, a prior art PDI (Post Detection Integration) circuit is proposed by Robert E. Kahn in a report entitled "Advances in Packet Radio Technology" of "Proceedings of the IEEE, Vol. 66 No. 11, November, 1978".

FIG. 7 is a block diagram of a PDI circuit arrangement including a matched filter 21, one-bit delay circuit 22, integrating circuit 23, zero-threshold circuit 24 and multiplier 25.

This shows an approach to data demodulation in a DPSK (differential phase shift keying) receiver where a matched filter output Y(t) (FIG. 8A) and a signal Z(t) (FIG. 8B) delayed by one bit from Y(t) are applied to and multiplied in the multiplier 25, and the signal Y(t)Z(t)[=U(t)] (FIG. 8C) is integrated in the period from A to B, both being repeated to effect data demodulation based on 0 (zero) level.

The integrating circuit 23 performs integration in the period from A to B, subsequently initializes (dumps) the integrated value once, and similar operations are further effected. That is, integration and dumping are repeated.

In this case, if the timing of the signal U(t) and the timing of the integration period from A to B are synchronous, all energy of U(t) is integrated, and data demodulation is attained (see FIG. 8D).

However, this is not accomplished in an initial synchronizing process before the synchronization is established. That is, when the integrating period from (A' to B') and the dumping period are not synchronous with the signal U(t) as shown in FIG. 8E, a signal inputted in the dumping period is not integrated, and part of information is lost.

OBJECT OF THE INVENTION

It is therefore a first object of the invention to provide an integrating circuit configured to process an output signal of a correlator by integrating and dumping it so that upon data demodulation, signal processing is ensured also when the said synchronization is not established.

A second object of the invention is to provide a spread spectrum receiver using such an integrating circuit.

SUMMARY OF THE INVENTION

According to the present invention, there is provided an integrating circuit comprising:

first and second integrating and dumping circuits each for integrating an input signal for a predetermined time and subsequently dumping an obtained integrated output;

control means for controlling said first and second integrating and dumping circuits so that when one of them behaves in its dumping mode, the other behaves in its integrating mode; and a composing circuit for adding outputs of said first and second integrating and dumping circuits.

In a preferred embodiment of the invention, the composing circuit is an adder and includes a switch for selectively, outputting an output of the first integrating and dumping circuit and an output of a second integrating and dumping circuit. Alternatively, the composing circuit includes a first switch for short-circuiting an output of the first integrating and dumping circuit, a second switch for short-circuiting an output of the second integrating and dumping circuit and an adder for summing outputs of the first and second integrating and dumping circuits.

In order to achieve the second object, an inventive spread spectrum receiver includes a first and second integrating and dumping circuits fed with the said correlation spike to perform integration for a predetermined time and to subsequently dump the integrated value, and includes a composing circuit for adding outputs of the first and second integrating and dumping circuits.

Under this arrangement, a correlator output is fed to the first integrating and dumping circuit and to the second integrating and dumping circuit, and outputs thereof are added by the composing circuit. The first integrating and dumping circuit and the second integrating and dumping circuit are controlled by the switch to produce their outputs selectively so that signal processing is ensured also in a non-synchronous condition.

BRIEF DESCRIPTION OF THE INVENTION

DETAILED DESCRIPTION

Figure 1:
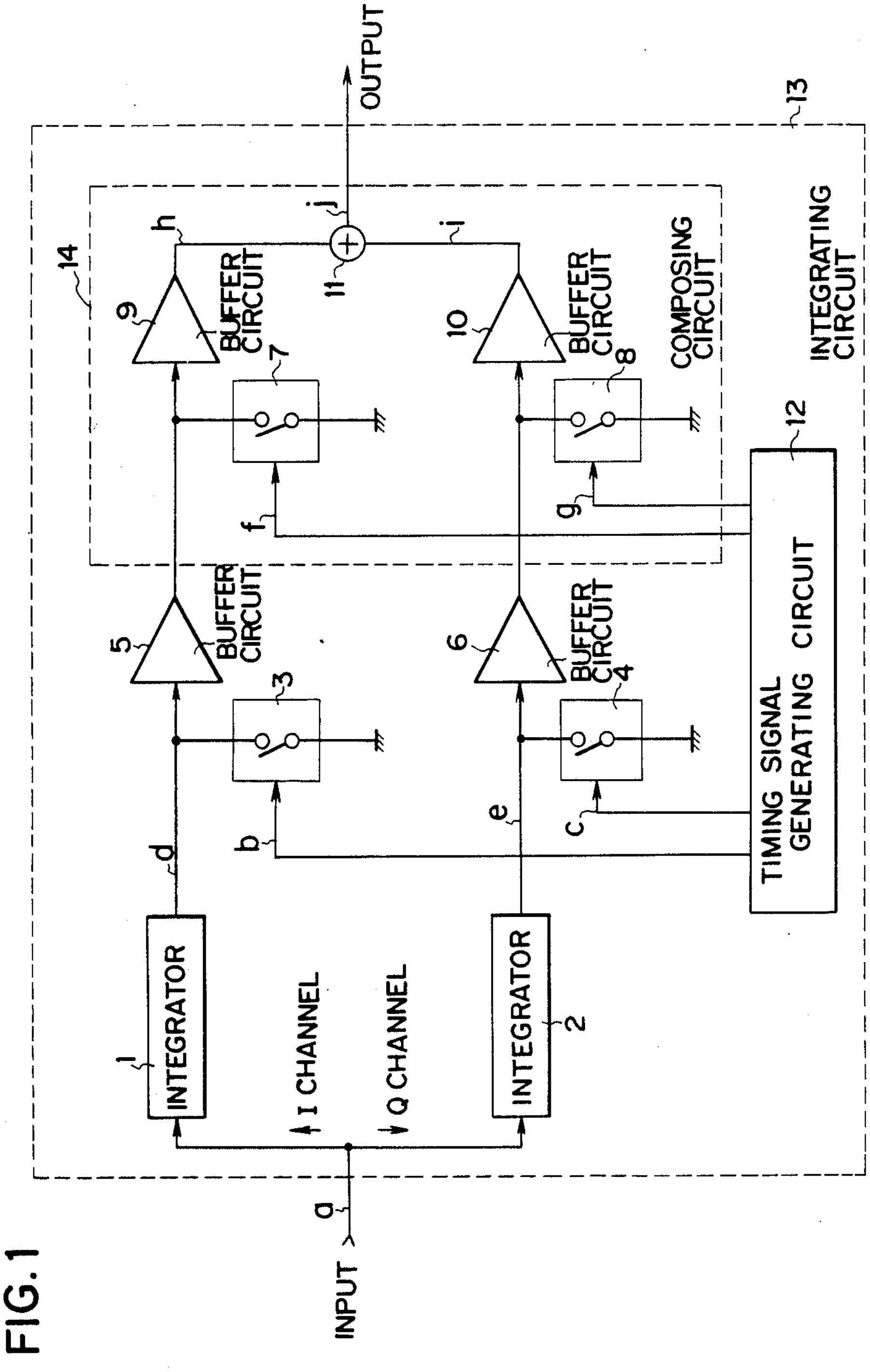
FIG. 1 is a block diagram showing an inventive integrating circuit.

The invention is described below in detail, referring to preferred embodiments illustrated in the drawings.

The embodiments are nothing but some examples, and the invention involves various modifications and improvements without departing the scope thereof.

FIG. 1 is a block diagram showing an inventive integrating circuit, and FIGS. 2A to 2J are timing charts showing an operation of the circuit of FIG. 1. In these drawings, reference numerals 1 and 2 denote integrators, 3 and 4 refer to integration/dumping switching analog switches, 5 and 6 to buffer circuits, 7 and 8 to I-channel/Q-channel switching analog switches, 9 and 10 to buffer circuits, 11 to an adder, 12 to a timing signal generating circuit, 13 to an integrating circuit, and 14 to a composing circuit.

Figure 2A:
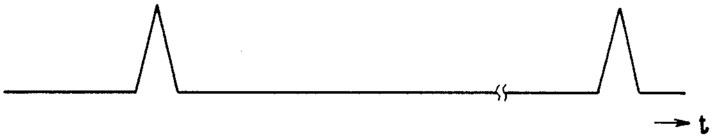
FIG. 2A–2J are timing wave forms relating to the circuit of FIG. 1.
Figure 2B:
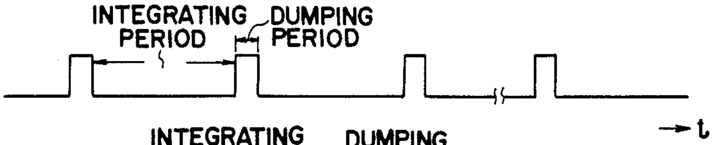
Figure 2C:
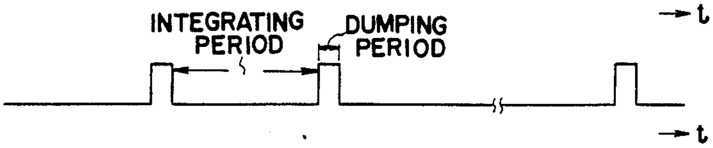
Figure 2D:
Figure 3A:
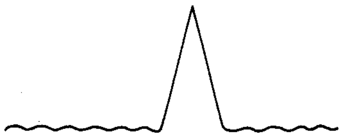
FIGS. 3A and 3B are waveform diagrams of an input signal.
Figure 3B:
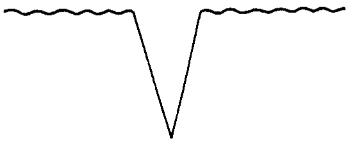

An inputted signal, i.e. a correlation spike of a correlator output, is shown as FIGS. 3A and 3B according to its data components. FIGS. 3A and 3B show waveforms of an input signal under no multipath, and FIG. 3A corresponds to data "1" while FIG. 3B corresponds to data "0". We shall take for purposes of discussion the case where the input signal is indicated by a (FIG. 2A). The inputted signal a is divided into two which are fed to an I channel and a Q channel respectively. The I channel and the Q channel have an identical arrangement except for the timings of integrating/dumping switching signals b (FIG. 2B) and c (FIG. 2C) outputted from the timing signal generating circuit 12.

Figure 2E:
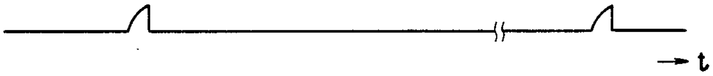
Figure 2F:
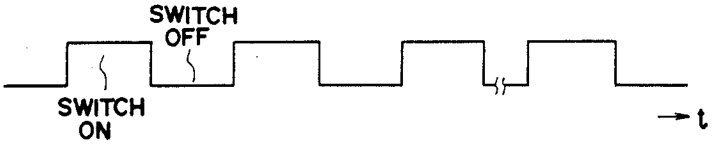
Figure 2G:
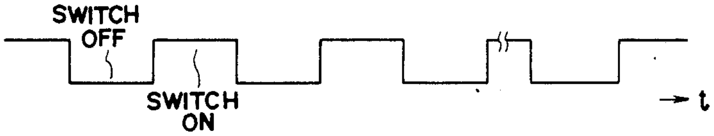
Figure 2H:
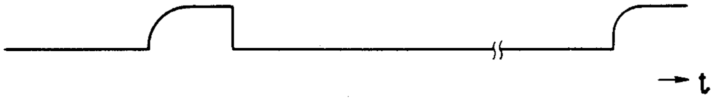
Figure 2I:

The input signal a is first integrated in the integrators 1 and 2, and subsequently integrated (charged) and dumped (discharged) by the analog switches 3 and 4 into waveforms d (FIG. 2D) and e (FIG. 2E). It is control signals produced from the timing signal generating circuit that activate the switching action. In the integrating period the switches 3 and 4 are turned off, while in the dumping period the switches 3 and 4 are turned on to discharge the integrated voltages.

Figure 4A:
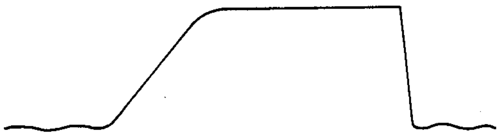
FIGS. 4A and 4B are waveform diagrams showing a voltage drop caused by leakage.
Figure 4B:

Therefore, in a period where a correlation spike of the input signal is present, a large integrated voltage value is obtained. It should be noted that the buffer circuits 5 and 6 are high input impedances, and are inserted so that the integrated voltage value is not decreased by leakage (see FIGS. 4A and 4B). FIG. 4(A) corresponds to no leakage condition while 4(B) corresponds to a leakage condition.

In order to add signals divided into I and Q channels, signal paths are switched by the analog switches 7 and 8. Signals f (FIG. 2F) and g (FIG. 2G) which control the analog switches 7 and 8 are produced by the timing signal generating circuit 12. When the controls signals f and g are "high", the switches 7 and 8 are turned on, so that an output of the buffer circuit 5 or 6 is connected to ground and becomes 0 (zero) volt. When the control signals f and g are "low", the switches 7 and 8 are turned off and detached from ground, so that the output of the buffer circuit 5 or 6 is entered in the adder 11.

Figure 2J:

The control signals f and g are in a compensating relationship, and when the switch 7 of the I channel is on, the switch 8 of the Q channel is off. A signal h (FIG. 2H) of the I channel and a signal i (FIG. 2I) of the Q channel are entered in the adder 11, and are added into an output j (FIG. 2J).

When the control signal for integration and dumping of the I channel is as shown by b (FIG. 2B), the control signal c (FIG. 2C) for integration and dumping of the Q channel is in a 90° shifted (90° delayed) relationship with respect to I. At this time, if the I channel is in the dumping period, the Q channel is in the integrating period.

In contrast, if the Q channel is in the dumping period, the I channel is in the integrating period. That is, I and Q are in a compensating relationship.

Therefore, by dividing the correlator output into two courses and arranging the integrators as described above, also when the timing of integration and dumping is not synchronous with the signal, a reliable integrated value is obtained. It should be noted that the I-channel/Q-channel switching analog switches 7 and 8 for the composing circuit 14 and the buffer circuits 9 and 10 may be omitted. In this case, however, the S/N ratio is slightly deteriorated.

Figure 5:
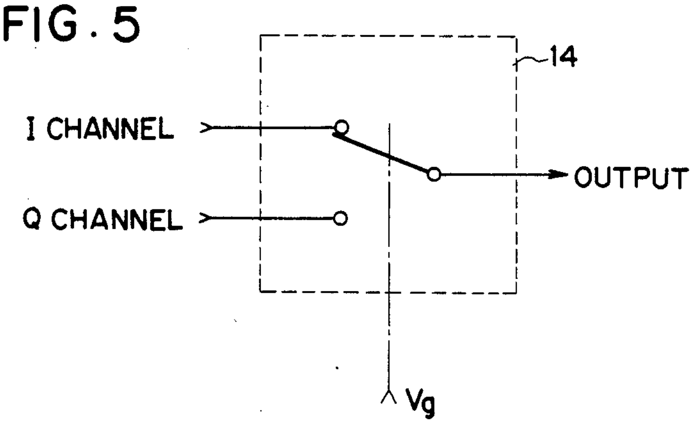
FIG. 5 is a circuit diagram of a composing circuit.
Figure 6A:
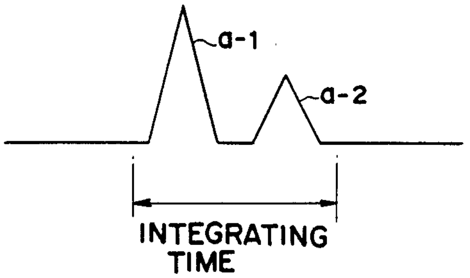
FIGS. 6A and 6B are waveform diagrams of a correlation spike.
Figure 6B:
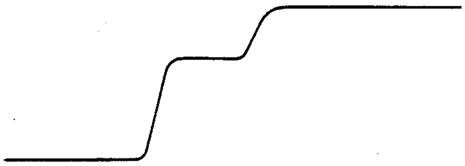
Figure 7:
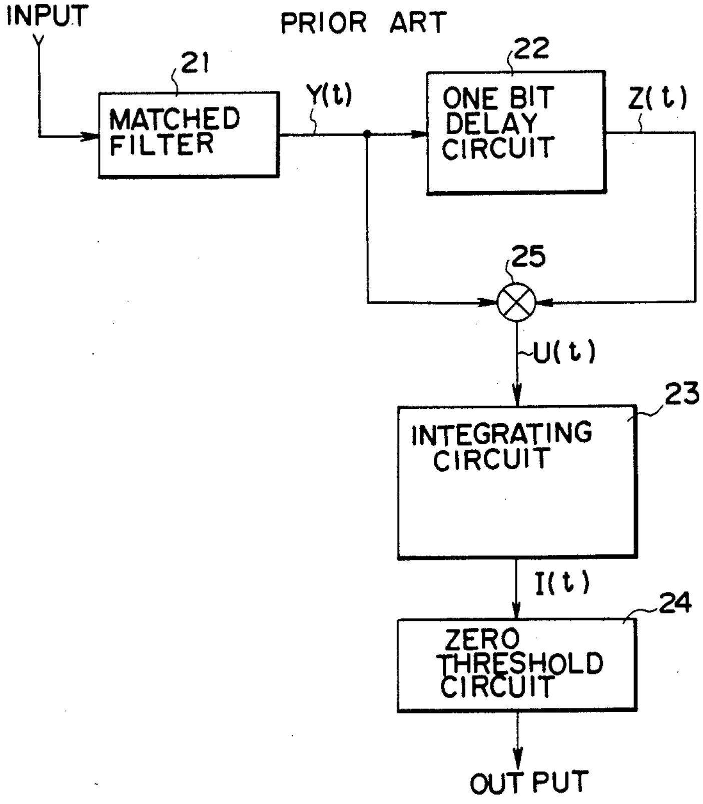
FIG. 7 PRIOR ART
FIG. 7 is a block diagram of a PDI circuit.

The composing circuit 14 may also be arranged as shown in FIG. 5 in which a control signal $V_G$ similar to the control signals f (FIG. 2F) and g (FIG. 2G) controls so that the respective switches are alternately turned on and off alternately to select a signal of the I channel or the Q channel.

Also when this arrangement is employed, an output similar to the adder output j (FIG. 2J) is obtained.

Figure 9:
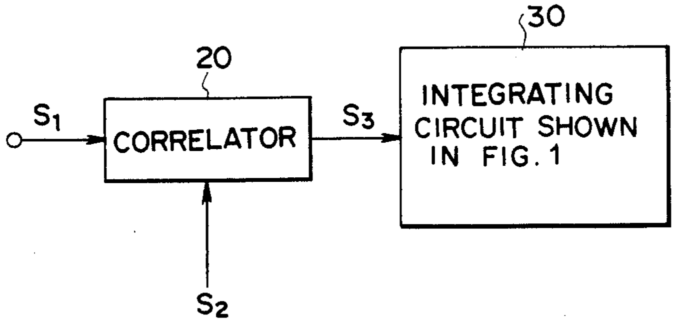
FIG. 9 is a block diagram of an inventive spread spectrum receiver.
Figures 8A, 8B, 8C, 8D, 8E:
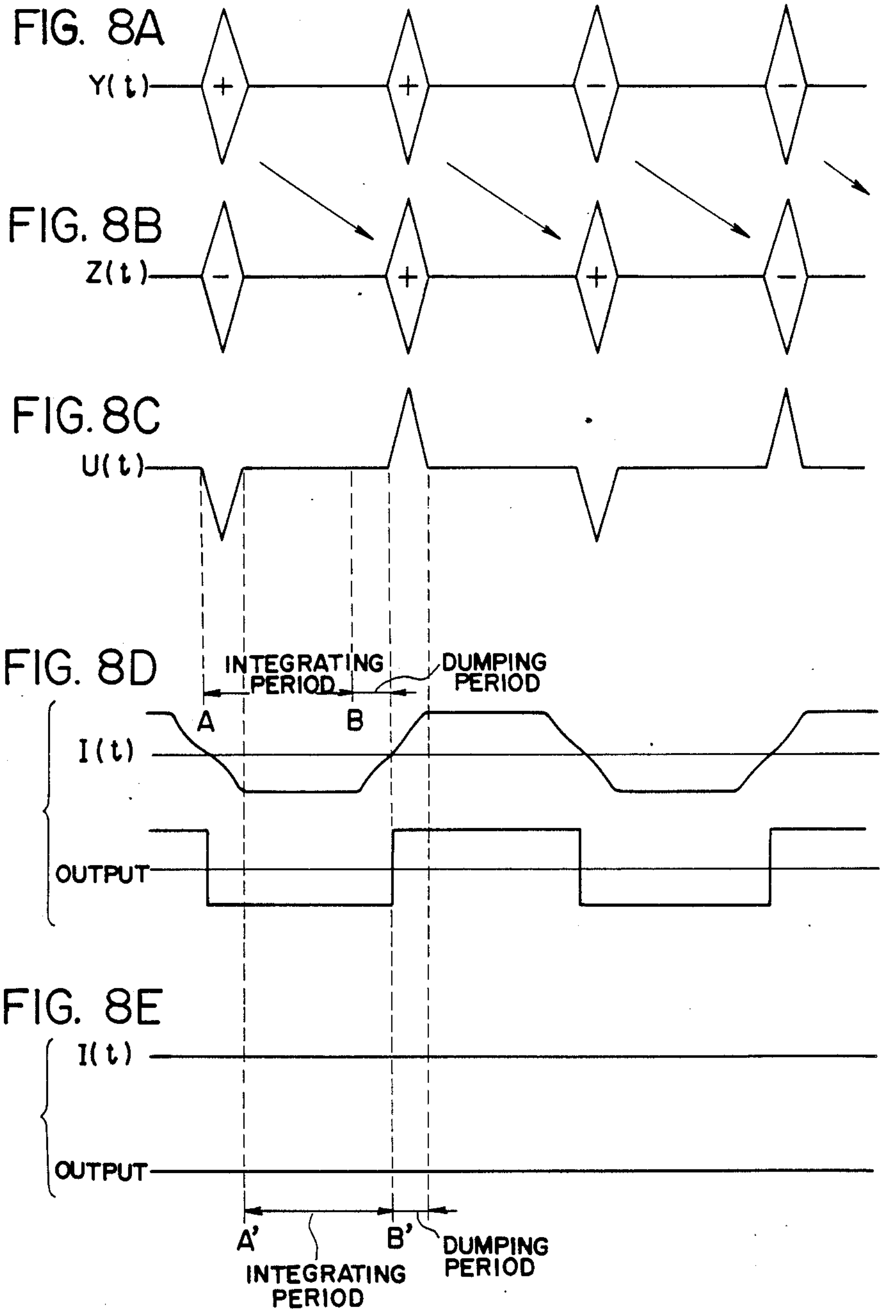
FIGS. 8A–8E show integrating and output wave form diagrams in synchronous and non-synchronous conditions.

As shown in FIG. 9, in a spread spectrum receiver using a correlator 20 to correlate a received signal $S_1$ with a reference signal $S_2$ produced inside the receiver to obtain a correlation spike $S_3$, by entering the correlation spike in an integrating circuit 30 as described above, loss of information never occurs also when the timing of integration and dumping does not synchronize with $S_1$.

The inventive integrating circuit is suitable not only for use in a spread spectrum receiver but also for use, for example, in a noise level measuring device to obtain an integrated value in a short time of an impulse noise which enters at a non-synchronous timing with the timing of integration and dumping.

As described above, according to the invention, the circuit can be used also when an input signal to be integrated and dumped is not synchronous with integration/dumping switching control signals. Further, loss of information is prevented.

What is claimed is:

1. An integrating circuit for a spread-spectrum receiver comprising:

correlating means for correlating a received signal with a reference signal to produce correlation spikes of positive and negative polarity;

first and second integrating and dumping circuits each for integrating said correlating spikes for a predetermined time and subsequently dumping the obtained integrated output;

control means for controlling said first and second integrating and dumping circuits so when one of them operates in a dumping mode the other operates in an integrating mode; and a composing circuit for forming a composite waveform representing the outputs of said first and second integrating and dumping circuits.

2. The integrating circuit according to claim 1 wherein said composing circuit is an adder.

3. The integrating circuit according to claim 1 wherein said composing circuit includes switch means operably responsive to said control means for selectively outputting the outputs of said first and second integrating and dumping circuits when they are in integrating mode.

4. The integrating circuit according to claim 1 wherein said composing circuit includes first switch means for short-circuiting the output of said first integrating and dumping circuit, second switch means for short-circuiting the output of said second integrating and dumping circuit and third switch means for summing the outputs of said first and second integrating and dumping circuits.

5. An integrating device for a spread-spectrum receiver comprising:

correlating means for correlating a received signal with a reference signal to provide correlation spikes;

first and second integrators for integrating said spikes;

first and second buffer circuits of a high input impedance connected to the outputs of said first and second integrators;

first an second switch means connected between ground and the outputs of said first and second integrators for controlling said first and second integrators to perform integration for a predetermined time and subsequently dump a resulting integration value in such a manner than when one of said integrators performs a dumping operation, the other integrator performs an integrating operation; and a composing circuit for forming a composite waveform representing the output of said first buffer circuit and the output of said second buffer circuit.

6. The integrating device according to claim 5 wherein said composing circuit includes third and fourth switch means connected between ground and the outputs of said first and second buffer circuits respectively, and including control means for controlling said third and fourth switch means so that when one of them takes its on-position, the other takes its off-position; and including an adding circuit for adding the output of said third switch means and the output of said fourth switch means.

7. The integrating device according to claim 5 wherein said composing circuit includes an adding circuit for adding said output of said first buffer circuit and said output of said second buffer circuit.

8. The integrating device according to claim 6 further including third and fourth buffer circuits interposed in respective input stages of said adding circuit.

9. The integrating device according to claim 5 wherein said composing circuit includes three-terminal switch means for alternately selecting either the output of said first buffer circuit or the output of said second buffer circuit.

* * * * *